(12) United States Patent
Schultz et al.

(10) Patent No.: US 6,525,562 B1
(45) Date of Patent: *Feb. 25, 2003

(54) PROGRAMMABLE LOGIC DEVICE CAPABLE OF PRESERVING STATE DATA DURING PARTIAL OR COMPLETE RECONFIGURATION

(75) Inventors: David P. Schultz, San Jose, CA (US); Lawrence C. Hung, San Jose, CA (US); F. Erich Goetting, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/136,141

(22) Filed: Apr. 30, 2002

Related U.S. Application Data

(62) Division of application No. 09/363,990, filed on Jul. 29, 1999.

(51) Int. Cl.[7] .............................................. H03K 19/177
(52) U.S. Cl. ............................................. 326/39; 326/41
(58) Field of Search ............................... 326/38, 39, 40, 326/41

(56) References Cited

U.S. PATENT DOCUMENTS

| | | | |
|---|---|---|---|
| 5,426,378 A | 6/1995 | Ong | 326/39 |
| 5,646,564 A | 7/1997 | Erickson et al. | 327/158 |
| 5,764,076 A | 6/1998 | Lee et al. | 326/38 |
| 5,781,756 A * | 7/1998 | Hung | 362/38 |
| 5,844,422 A * | 12/1998 | Trimberger et al. | 326/38 |
| 5,886,537 A * | 3/1999 | Macias et al. | 326/40 |
| 5,889,413 A | 3/1999 | Bauer | 326/40 |
| 5,914,616 A | 6/1999 | Young et al. | 326/41 |
| 6,107,821 A | 8/2000 | Kelem et al. | 326/38 |
| 6,172,520 B1 | 1/2001 | Lawman et al. | 326/38 |
| 6,191,613 B1 | 2/2001 | Schultz et al. | 326/39 |
| 6,255,849 B1 | 7/2001 | Mohan | 326/41 |
| 6,278,290 B1 * | 8/2001 | Young | 326/41 |
| 6,289,068 B1 | 9/2001 | Hassoun et al. | 327/156 |

OTHER PUBLICATIONS

U.S. patent application Ser. No. 08/786,818, Chapman et al., filed Jan. 21, 1997.

Xilinx, Inc., "The Programmable Logic Data Book," Jul. 30, 1996, pp. 4–59–pp. 4–63.

Xilinx, Inc., "XCell:The Quarterly Journal for Programmable Logic Users," First Quarter, 1999.

* cited by examiner

*Primary Examiner*—Trong Phan
(74) *Attorney, Agent, or Firm*—Arthur J. Behiel; Edel M. Young

(57) ABSTRACT

A programmable logic device (PLD) can be reconfigured without losing state data derived from logical operations performed using a previous logic configuration. One PLD in accordance with the invention includes a number of configurable logic blocks (CLBS) and input/output blocks (IOBs). Each CLB and IOB includes a number of configuration memory cells adapted to store the logical function of the FPGA. Each CLB and IOB additionally includes user storage elements adapted to store state data that results from the PLD performing a programmed logical function, such as a selected combinatorial function of input signals. The PLD preserves the data stored in the user storage element as the PLD is reconfigured. The state data is therefore available for use by the PLD after the PLD is reconfigured to perform a new logic function.

15 Claims, 5 Drawing Sheets

PROGRAMMABLE LOGIC DEVICE CAPABLE OF PRESERVING STATE DATA DURING PARTIAL OR COMPLETE RECONFIGURATION

CROSS REFERENCE TO RELATED APPLICATIONS

This application is a divisional of U.S. patent application Ser. No. 09/363,990, entitled "Programmable Logic Device Capable of Preserving User Data During Partial or Complete Reconfiguration," by Schultz et al., filed Jul. 29, 1999, which is incorporated herein by reference.

FIELD OF THE INVENTION

This invention relates generally to programmable logic devices, and in particular to programmable logic devices that include sequential storage elements, the contents of which may be preserved during partial or complete reconfiguration.

BACKGROUND

Programmable logic devices (PLDs) are a well-known type of digital integrated circuit that may be programmed by a user (e.g., a circuit designer) to perform specified logic functions. PLDs are becoming ever more popular, largely because they are less expensive in relatively small quantities and require less time to implement than semi-custom and custom integrated circuits.

FIG. 1 is a block diagram of one type of PLD, a field-programmable gate array (FPGA) 100. FPGA 100 includes an array of configurable logic blocks (CLBS) 110 that are programmably interconnected to each other and to programmable input/output blocks (IOBs) 120. The interconnections are provided by a complex interconnect matrix represented as horizontal and vertical interconnect lines 130 and 140. This collection of configurable elements and interconnect may be customized by loading configuration data into internal configuration memory cells (not shown) that define how the CLBs, interconnect lines, and IOBs are configured. The configuration data may be read from memory (e.g., an external PROM) or written into FPGA 100 from an external device. The collective program states of the individual memory cells then determine the function of FPGA 100.

CLBs 110 and IOBs 120 additionally include user-accessible memory elements (not shown), the contents of which can be modified as FPGA 100 operates as a logic circuit. These user-accessible memory elements, or "user logic," include block RAM, latches, and flip-flops. The data stored in user logic is alternatively referred to as "user data" or "state data."

The power of FPGA 100 is that its logical function can be changed at will. Such changes are accomplished by reloading the configuration memory cells and resetting (or presetting) the user logic. In some applications it is desirable to make minor changes to the configuration of an FPGA. Presently, even small modifications require FPGA 100 undergo the time-consuming process of a complete reconfiguration. Further, if any state data is to be retained for use with the subsequent configuration, the state data must be read from FPGA 100 prior to reconfiguration and then loaded back into user logic when reconfiguration is complete. This process is also time consuming. There is therefore a need for a programmable logic device that can be partially reconfigured, and that can be fully or partially reconfigured without a loss of state data.

SUMMARY

The present invention is directed to a programmable logic device (PLD) that can be fully or partially reconfigured without losing (i.e., while preserving) state data. One PLD in accordance with the invention, a field-programmable gate array (FPGA), includes a number of configurable logic blocks (CLBs) and input/output blocks (IOBs). Each CLB and IOB includes a number of configuration memory cells adapted to define the logical function of the FPGA. Each CLB and IOB additionally includes user storage elements adapted to store state data that results from the FPGA performing a programmed logical function, such as a selected combinatorial function of input signals.

In accordance with the invention, the FPGA also includes a state machine, or "sequencer," which controls several global signals, where "global" means that the signals are broadcast throughout the FPGA. The sequencer is capable of performing a shut-down sequence that manipulates the global signals in a way that places the FPGA in a "safe" mode. The safe mode protects against potentially destructive interconnect contention that might otherwise occur during reconfiguration, and therefore allows all or a portion of the FPGA to be reconfigured without powering down or resetting the FPGA. This process saves valuable time, particularly when only a relatively small portion of the FPGA need be reprogrammed.

Also advantageous, the sequencer can be instructed to preserve state data during reconfiguration. The preserved state data is then available for use by the FPGA after the FPGA is reconfigured to perform a new logic function. The present invention thus eliminates the need to save state data externally if any state data is to be retained for use with a subsequent configuration.

DETAILED DESCRIPTION

Figure 1:
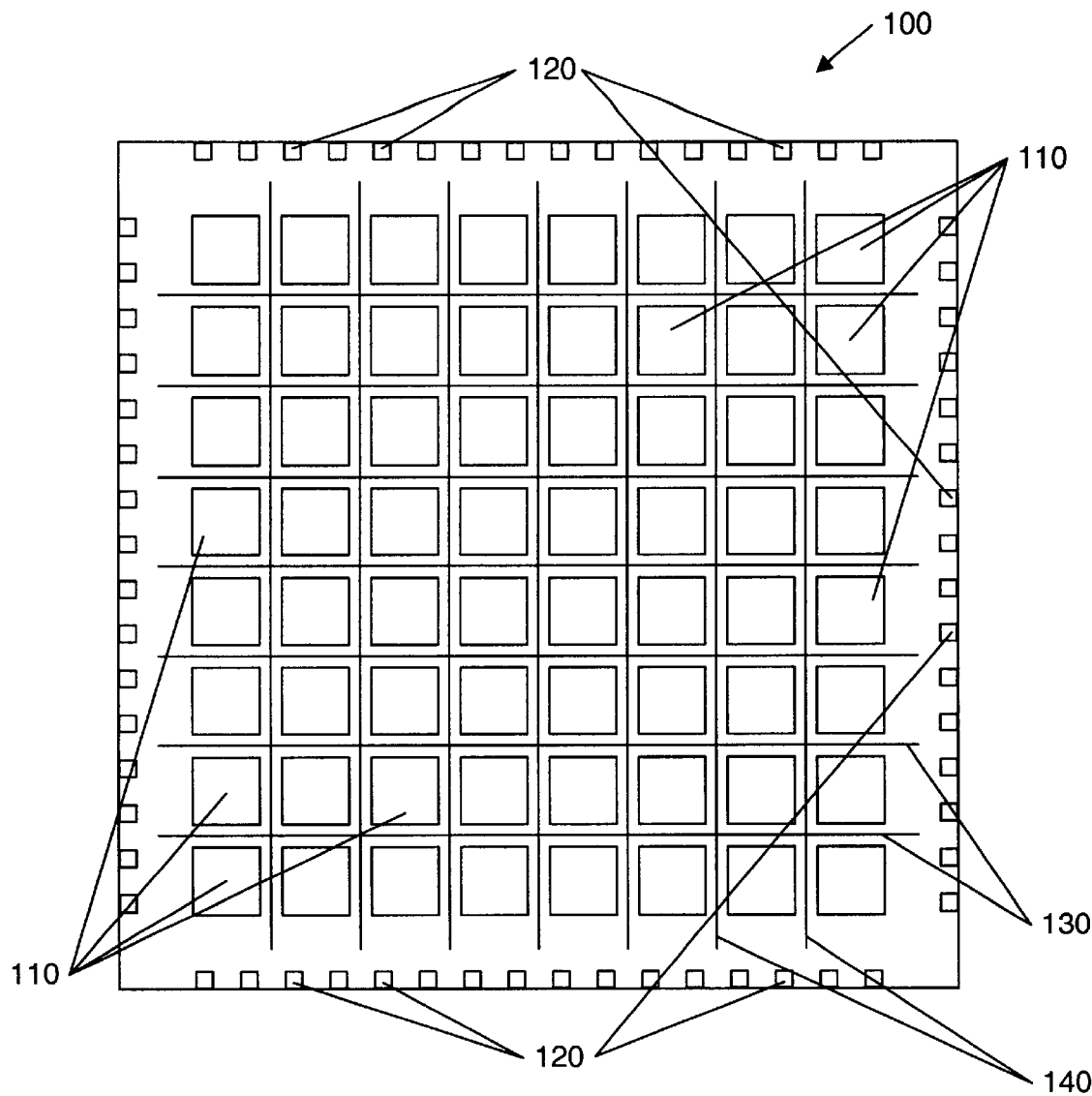
FIG. 1 is a block diagram of one type of PLD, a field-programmable gate array (FPGA) 100.
Figure 2:
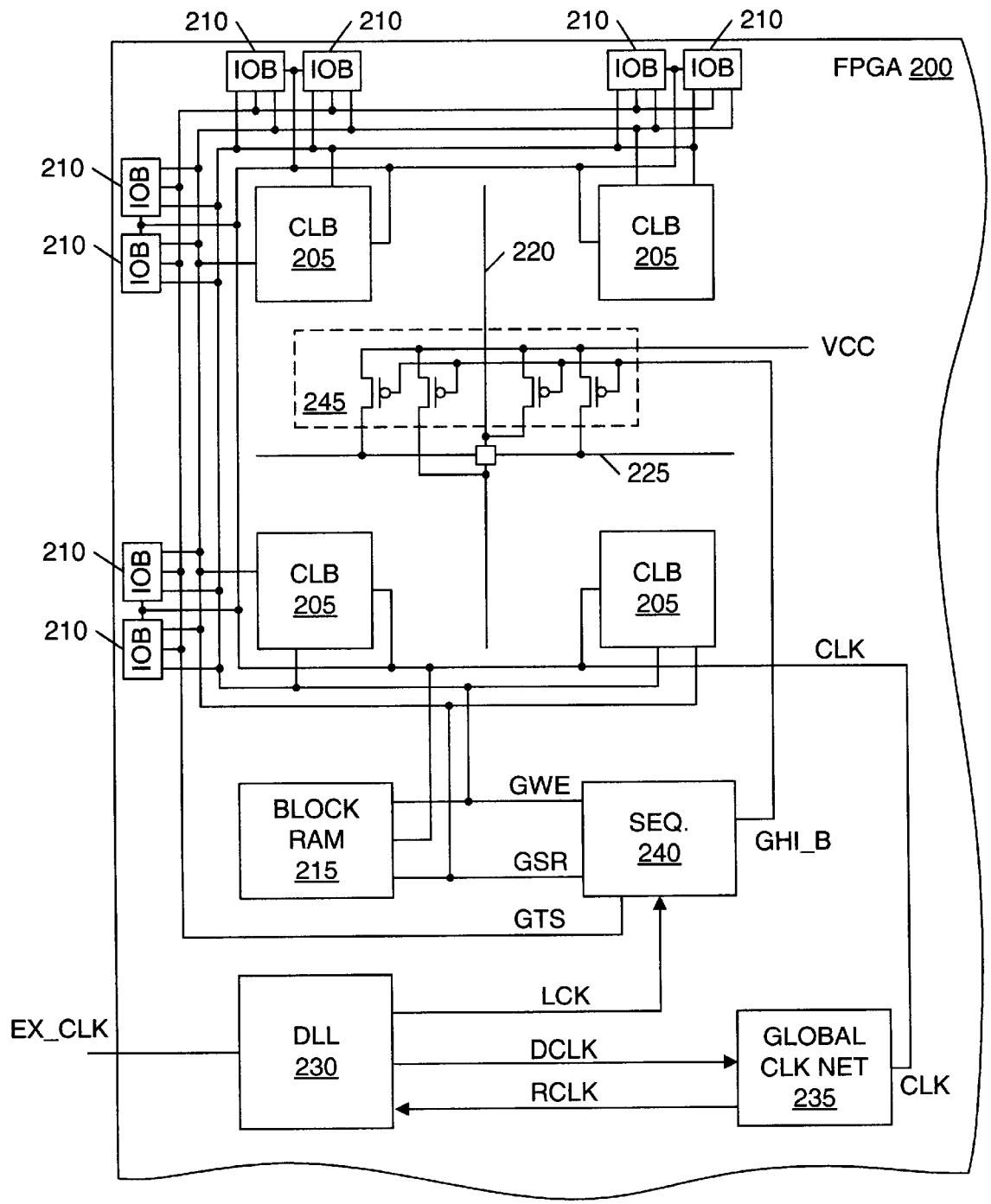
FIG. 2 schematically depicts a portion of an FPGA 200 that, in accordance with the invention, can be partially reconfigured.

FIG. 2 schematically depicts a portion of an FPGA 200 that, in accordance with the invention, can preserve state data during a full or partial reconfiguration. FPGA 200 includes CLBs 205, IOBs 210, block RAM 215, and a complex programmable interconnect matrix represented by interconnect lines 220 and 225. These programmable elements function largely as discussed above in connection with FIG. 1, but are modified in accordance with the invention to support both partial reconfiguration and the retention of state data during reconfiguration. FPGA 200 also includes a delay-locked loop DLL 230, a global clock network 235, and a sequencer 240. A set of PMOS transistors 245 selectively connects interconnect lines 225 and 220 to a supply voltage VCC.

Sequencer 240 controls the configuration process, including full and partial reconfiguration. Sequencer 240 connects to each CLB 205, IOB 210, and block RAM 215 via a global write-enable line GWE and a global set/reset line GSR. Each of lines GWE and GSR is connected to sequential memory elements (See FIGS. 4 and 5) within CLBs 205, IOBs 210, and block RAM 215. Global write-enable line GWE, when asserted, allows state data stored in CLBs 205, IOBs 210, and block RAM 215 to be overwritten with new data; negating (i.e., de-asserting) line GWE protects the state data. Asserting global set/reset line GSR globally sets or resets each sequential memory element within FPGA 200. As will be discussed in connection with FIGS. 3 and 4, each sequential memory element within CLBs 205 and IOBs 210 can be programmed to either set or reset in response to an assertion of global set/reset line GSR. This configuration option determines the state in which each sequential memory element becomes operational after FPGA 200 is configured.

For additional information on the internal workings of CLBs 205 and IOBs 210, see the related U.S. Pat. No. 6,191,613, entitled "Programmable Logic Device With Delay-Locked Loop," by David P. Schultz, Lawrence C. Hung, and F. Erich Goetting, which is incorporated herein by reference.

Sequencer 240 connects to each transistor in set 245 via a global line GHI_B (the "B" is for "bar," and identifies the signal as an active low). When asserted (i.e., brought low), line GHI_B pulls each interconnect line 220 and 225 and each interconnect driver (not shown) to a logic one (hereafter referred to as "disabling the interconnect"). Sequencer 240 asserts the signal on line GHI_B during the configuration process to avoid data contention that might otherwise occur between interconnect lines.

The final global line from sequencer 240, the global tri-state line GTS, connects to each IOB 210. Sequencer 240 tri-states the output of each IOB 210 during configuration, effectively disconnecting FPGA 200 from input/output pads on FPGA 200 (see FIG. 4) to avoid data contention.

DLL 230 is a delay-locked loop circuit that synchronizes an external clock signal on a clock line EX_CLK with a reference clock signal on line RCLK from global clock network 235. DLL 230 connects to sequencer 240 via a lock line LCK and to global clock network 235 via a data-clock line DCLK. DLL 230 provides a lock signal on line LCK to signal sequencer 240 that the reference clock signal on line RCLK is locked in phase with an external clock on input line EX_CLK. Global clock network 235 is a buffered clock tree that distributes the data-clock signal on line DCLK to each CLB 205, IOB 210, and block RAM 215 via clock lines CLK and back to DLL 230 via line RCLK. For a detailed discussion of an appropriate DLL and clock network for use in the present invention, see Joseph H. Hassoun, F. Erich Goetting, and John D. Logue, "Delay Lock Loop With Clock Phase Shifter," U.S. Pat. No. 6,289,068 B1, issued Sep. 11, 2001, which is incorporated herein by reference.

Figure 3:
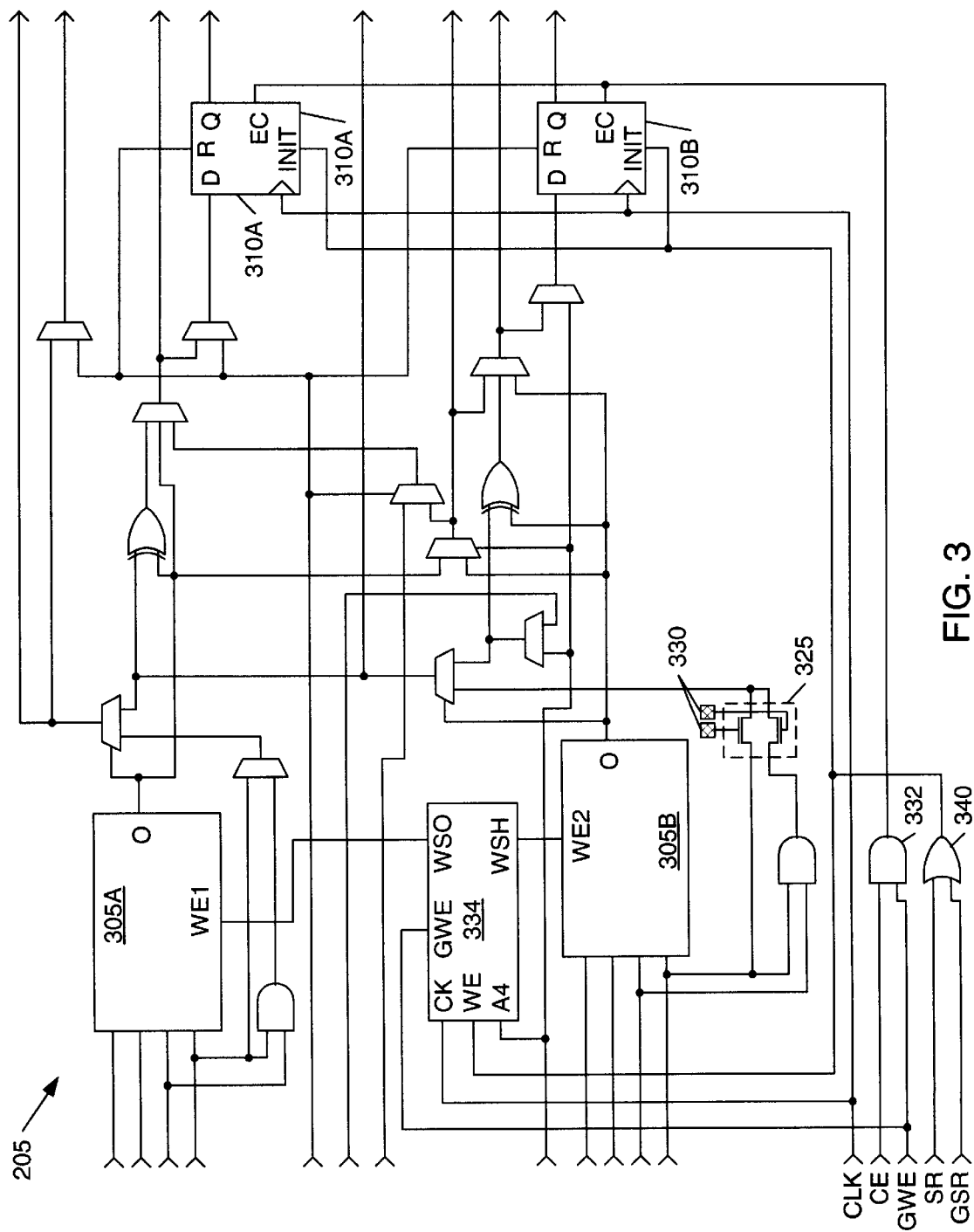
FIG. 3 is a schematic diagram of an exemplary CLB 205.

FIG. 3 is a schematic diagram of a portion of an exemplary CLB 205 similar to those of the Virtex™ family of devices available from Xilinx, Inc. All of the terminals to and from CLB 205 are connected to horizontal or vertical interconnect lines 220 and 225 (see FIG. 2) through which they can be programmably connected to various other components within FPGA 200.

CLB 205 includes two 4-input look-up tables (LUTs) 305A and 305B. LUTs 305A and 305B are each capable of implementing any arbitrarily defined Boolean function of up to four inputs. In addition, each of LUTs 305A and 305B can provide a 16×1-bit synchronous RAM. Furthermore, the two LUTs can be combined to create a 16×2-bit or 32×1-bit synchronous RAM, or a 16×1-bit dual-port synchronous RAM. When configured as RAM, LUTs 305A and 305B store state data.

CLB 205 also includes a pair of sequential storage elements 310A and 310B that can be configured either as edge-triggered D-type flip-flops or as level-sensitive latches. The D inputs can be driven either by LUTs 305A and 305B or directly from input terminals, bypassing LUTs 305A and 305B. Each storage element includes an initialization terminal INIT, a reverse-initialization terminal R, an enable-clock terminal EC, and a clock terminal conventionally designated using the symbol ">". The INIT terminal forces the associated storage element into an initialization state specified during configuration; the reverse-initialization terminal R forces the storage element in the opposite state as the INIT terminal. Terminals INIT and R can be configured to be synchronous or asynchronous, and all control inputs are independently invertable.

Configuration memory cells define the functions of the various configurable elements of FPGA 200. An exemplary two-input multiplexer 325 includes a pair of MOS transistors having gate terminals connected to respective configuration memory cells 330. Other configuration memory cells used to define the functions of the remaining programmable elements of FPGA 200 are omitted for brevity. The use of configuration memory cells to define the function of programmable logic devices is well understood in the art.

A detailed discussion of CLB 205 is not necessary for understanding the present invention, and is therefore omitted for brevity. For a more detailed treatment of the operation of many components within CLB 205, see (1) U.S. Pat. No. 6,427,156, issued Jul. 30, 2002, entitled "Configurable Logic Block with AND Gate for Efficient Multiplication in FPGAs," by Chapman et al., (2) U.S. Pat. No. 5,889,413, issued on Mar. 30, 1999, entitled "Lookup Tables Which Double as Shift Registers," by Bauer, and (3) U.S. Pat. No. 5,914,616, issued on Jun. 22, 1999, entitled "FPGA Repeatable Interconnect Structure with Hierarchical Interconnect Lines," by Steven P. Young, et al. Each of the foregoing documents is incorporated herein by reference.

In accordance with the invention, global write-enable line GWE connects through an AND gate 332 to storage elements 310A and 310B. Global write-enable line GWE, when asserted, allows state data stored in storage elements 310A and 310B, as well as similar flip-flops in other CLBs, to be overwritten with new data. Write-enable line GWE also connects to the write-enable terminals WE of LUTs 305A and 305B through some write-strobe logic 334. Write-strobe logic 334 handles writing to memory in LUTs 305A and 305B, and is discussed in detail in the above-incorporated application entitled "FPGA Repeatable Interconnect Structure with Hierarchical Interconnect Lines." Write-strobe logic 334 allows the global write-enable signal on line GWE to protect data within LUTs 305A and 305B when LUTs 305A and 305B are configured as user memory. Whether flip-flops 310A and 310B are write enabled can also be locally controlled by a control line CE, provided control line GWE is already asserted.

Set/reset line SR and global set/reset line GSR connect through an OR gate 340 to the initialization terminal INIT of storage elements 310A and 310B. As discussed above, each initialization terminal INIT forces the associated storage elements into an initialization state specified during configuration. Thus, the initialization states of storage elements 310A and 310B can be locally controlled using control line SR or can be globally controlled using global set/reset line GSR.

Set/reset line SR and global set/reset line GSR also connect through OR gate 340 and write-enable logic 334 to the respective write-enable terminals WE1 and WE2 of LUTs 305A and 305B. Set/reset lines SR and GSR can therefore be used either as write-enable control lines for LUTs 305A and 305B when those elements are configured as RAM, or, as mentioned above, can be used as set/reset control lines for storage elements 310A and 310B.

Figure 4:
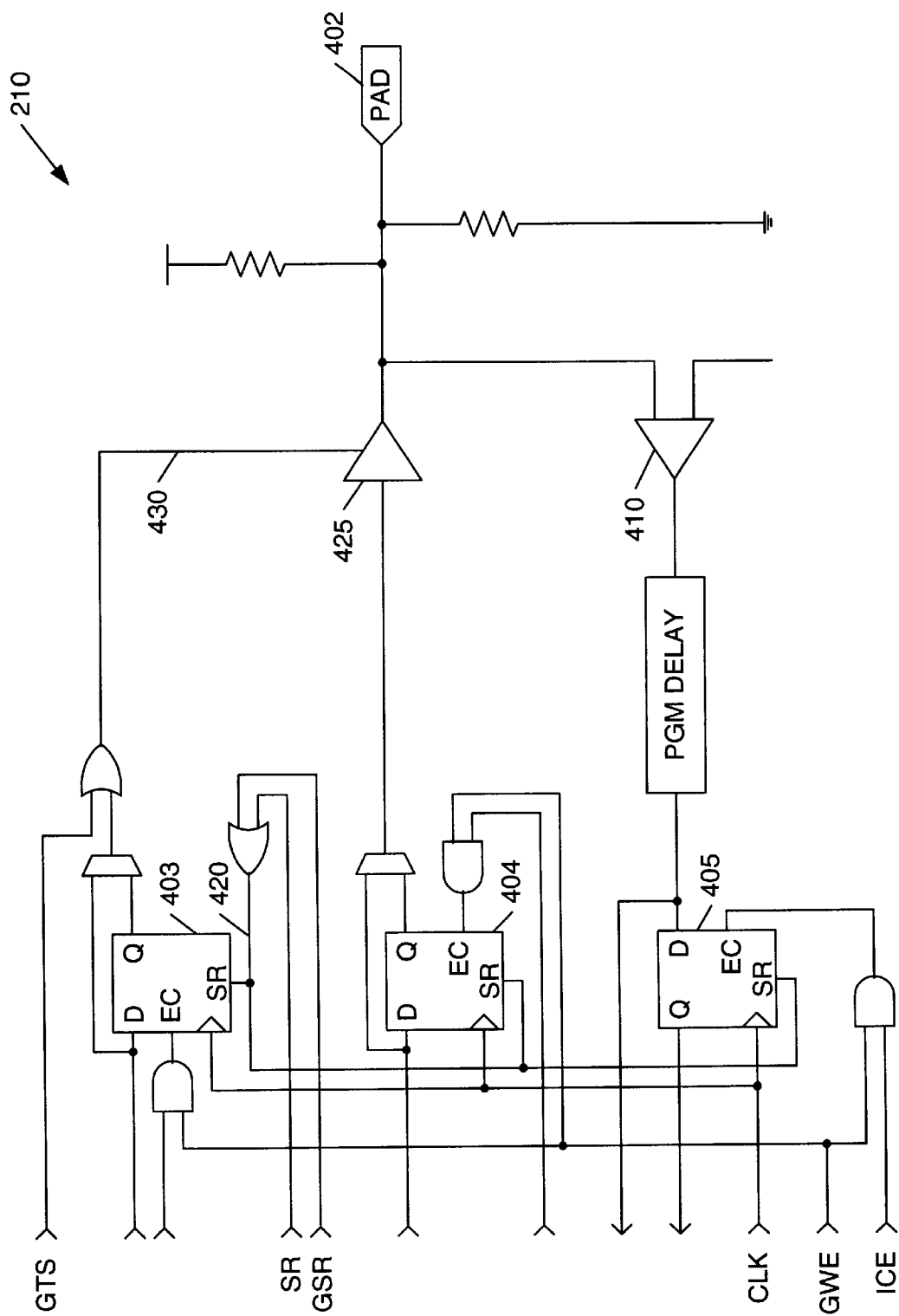
FIG. 4 depicts an exemplary IOB 210.

FIG. 4 depicts an exemplary IOB 210 similar to those of the Virtex™ family of devices available from Xilinx, Inc. IOB 210 provides the interface between an external package pad 402 and some internal logic via interconnect lines 220 and 225 (FIG. 2). IOB 210 can be configured for input, output, or bidirectional signals. When configured as an input block, IOB 210 conveys input signals into internal circuitry of FPGA 200 from I/O pad 402 through an input buffer 410. When IOB 210 is configured as an output block, IOB 210 conveys output signals from internal circuitry (e.g., CLBs 205) to I/O pad 402 through output buffer 425. A more complete discussion of IOB 210 can be found in Xilinx, Inc., *Virtex Data Sheet, Xcell*, Issue 31, First Quarter 1999, at pp. 41–53, which is incorporated herein by reference.

IOB 210 includes three sequential storage elements 403, 404, and 405. Each storage element includes an enable-clock input EC, and a set/reset input SR. The various programmable elements depicted in FIG. 4 are controlled by configuration memory cells (not shown) similar to memory cells 330 of FIG. 3.

A local set/reset line SR controls the logic level on set/reset line 420, and therefore sets and resets storage elements 403, 404, and 405. Storage elements 403, 404, and 405 (and the similar storage elements in the other IOBs and CLBs) can also be globally set or reset. Thus, storage elements 403, 404, and 405 can be reset by either a local set/reset signal on line SR or a global set/reset signal on global set/reset line GSR.

IOB 210 includes an output buffer 425 that can be tri-stated by providing a signal on a line 430. I/O pad 402 can be tri-stated individually by asserting local tri-state line T, or all of IOBs 210 of FIG. 2 can be globally tri-stated using line global tri-state line GTS.

Figure 5:
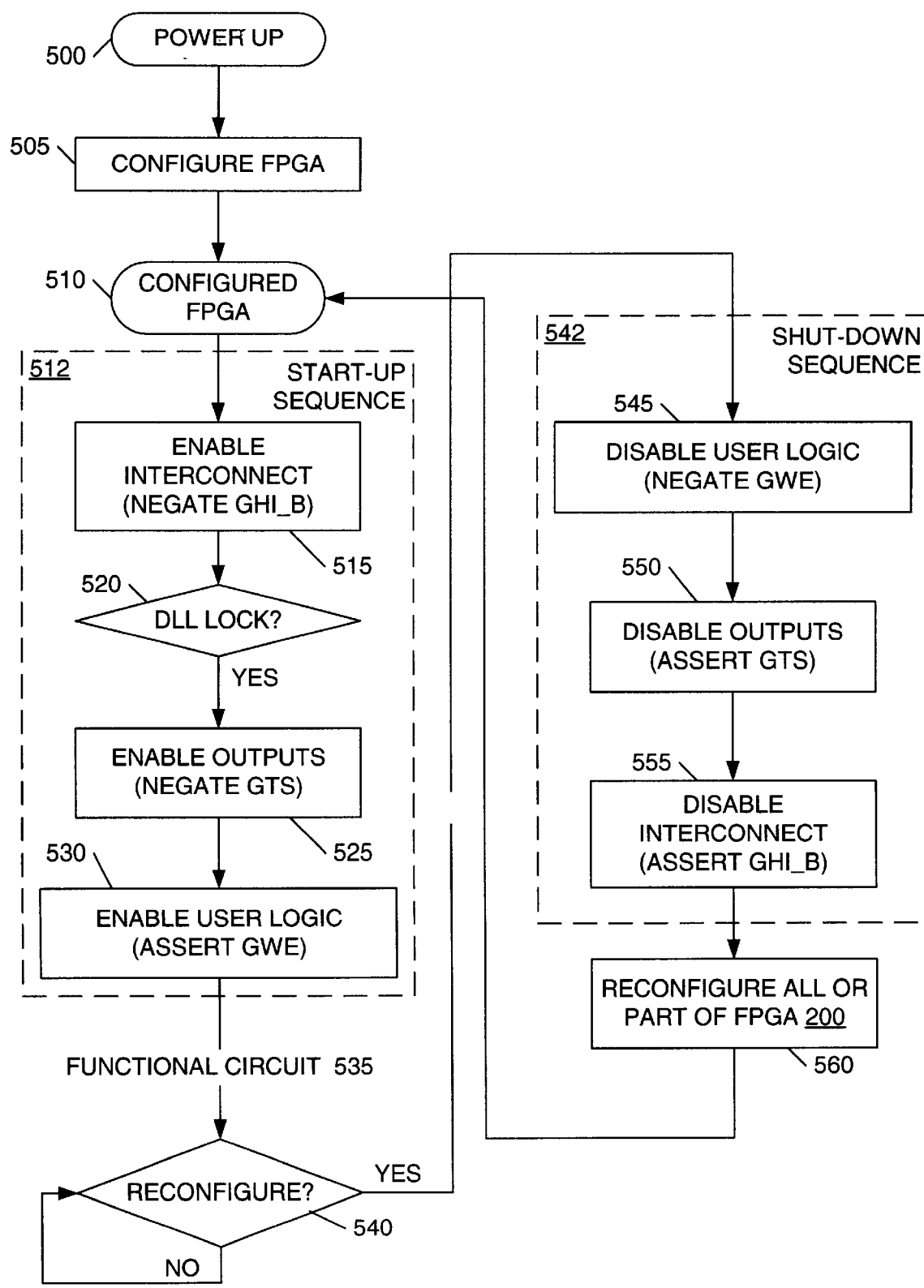
FIG. 5 is a flow chart illustrating the operation of sequencer 240 of FIG. 2.

FIG. 5 is a flow chart illustrating the operation of sequencer 240 of FIG. 2. The process begins at step 500, when FPGA 500 is powered up. After power up, global write-enable signal GWE is negated to disable user storage, global tri-state signal GTS is asserted to isolate IOBs 210 from external circuitry, and signal GHI_B is asserted to disable interconnect lines 220 and 225 (e.g., pulling the signal on these lines to a logic one). Next, in step 505, FPGA 200 is configured, which is to say that the configuration memory cells within FPGA 200 are programmed to define some desired logical function. The process of configuring an FPGA to perform a logical function is well understood to those of skill in the art.

Once configured, FPGA 200 steps through a start-up sequence 512. The first step of start-up sequence 512 (step 515) is to enable interconnect lines 220 and 225 by negating the signal on line GHI_B. As mentioned previously, the signal on line GHI_B is asserted (pulled to a logic zero) during configuration to avoid data conflicts between functional elements (e.g., CLBs and IOBs) of FPGA 200. Sequencer 240 then waits for a "lock" signal (step 520) on line LCK from DLL 230. DLL 230 asserts the lock signal after the external clock signal on line EX_CLK is synchronized with the reference clock signal on line RCLK from global clock network 235. This synchronization is necessary to ensure that the various components of FPGA 200 are receiving reliable clock signals before those components are activated.

Next, in step 525, sequencer 240 negates global tri-state signal GTS, thereby enabling IOBs 210 to communicate with devices external to FPGA 200. Sequencer 240 then asserts global write-enable signal GWE (step 530), which allows the FPGA 200 to write to user logic (e.g., storage elements 310A and 310B of FIG. 3). Sequencer 240 also negates the global set/reset signal GSR in step 530 to release each sequential storage element in FPGA 200 from a preset state. Upon completion of step 530, FPGA 200 is a fully functional logic circuit 535.

FPGA 200 remains operational as logic circuit 535 until FPGA 200 is powered off, reset, or receives a reconfiguration command. If powered off, FPGA 200 may be powered up and reconfigured (steps 500 and 505), and thereby return to step 510. A system reset similarly returns FPGA 200 to step 510. In accordance with the invention, FPGA 200 can also be fully or partially reconfigured without completely powering off or resetting FPGA 200, thus reducing the time required for reconfiguration. This reconfiguration process begins at step 540.

FPGA 200 enters a shut-down sequence 542 upon receipt of a reconfiguration command. Shut-down sequence 542 preserves selected state data and protects various elements within FPGA 200 from data contention. Shut-down sequence 542 also readies FPGA 200 to receive new configuration data and/or new state data.

Shut-down sequence 542 begins at step 545, in which sequencer 240 disables user logic (e.g., storage elements 310A and 310B of FIG. 3 and storage elements 403, 404, and 405 of FIG. 4) by negating the global write-enable signal GWE. This operation preserves any state data derived during previous logical operations by disabling the go clock terminals of the user logic. The signal on line GSR is not asserted if state data is to be preserved through the reconfiguration process.

Next, to avoid IOB data contention, each IOB 210 is tri-stated by asserting the global tri-state signal GTS (step 550). Finally, in step 555, all of interconnect lines 220 and 225 are disabled by asserting GHI_B to avoid data contention between FPGA components.

The shut-down sequence places FPGA 200 in a "safe" mode that allows all or a portion of FPGA 200 to be reconfigured without causing potentially destructive data contentions between circuits within or external to FPGA 200. FPGA 200 is then either wholly or partially reconfigured (step 560), thereby returning the process of FIG. 5 to step 510. FPGA 200 is conventionally configured using a series of frames of configuration data. FPGA 200 may be fully or partially reconfigured by writing over one or more frames of configuration data. The ability to reconfigure FPGA 200 without powering down or resetting the device saves valuable time, particularly when only a portion of FPGA 200 need be reconfigured.

Once reconfigured, FPGA 200 once again traverses the steps of start-up sequence 512. Step 515 enables interconnect lines 220 and 225 by negating the signal on line GHI_B. The process generally passes through step 520 quickly, as DLL 230 should remain locked throughout reconfiguration. Eliminating the need to wait for DLL 230 to lock is one reason that shut-down sequence 540 saves time over conventional reconfiguration methods.

Next, in step 525, sequencer 240 negates global tri-state signal GTS, enabling IOBs 210 to communicate with external circuitry. Sequencer 240 then asserts global write-enable signal GWE (step 530). If GSR was asserted in shut-down, sequencer 240 may also negate the global set/reset signal GSR in step 530 to release from preset each sequential storage element in FPGA 200. Upon completion of start-up sequence 512, FPGA 200 is once again functional, this time performing the new logic function specified during the full or partial reconfiguration.

One advantage of the invention is that sequencer 240 is programmable, and thereby offers operational flexibility in satisfying the requirements of particular PLD applications. For example, sequencer 240 can be programmed to enable the output terminals of FPGA 200 (step 525) before DLL 230 asserts the lock signal (step 520). Such an implementation is useful, for example, when the external clock EX_CLK (FIG. 2) is generated on FPGA 200 and then distributed to other external circuits and back to FPGA 200. DLL 230 will not be able to synchronize the locally created external clock unless IOBs 210 are enabled to make the external clock available to DLL 230.

While the present invention has been described in connection with specific embodiments, variations of these embodiments will be obvious to those of ordinary skill in the art. For example, the various global signals might be grouped into regional signals that control subsets of the programmable logic on a given FPGA. In one embodiment, FPGA resources divided into two regions, each controlled by separate sets of regional signals. Moreover, some components are shown directly connected to one another while others are shown connected via intermediate components. In each instance the method of interconnection establishes some desired electrical communication between two or more circuit nodes, or terminals. Such communication may often be accomplished using a number of circuit configurations, as will be understood by those of skill in the art. Therefore, the spirit and scope of the appended claims should not be limited to the foregoing description.

What is claimed is:

1. A method of configuring a programmable logic device, the method comprising:
   a. writing a first collection of configuration data into a plurality of configuration memory cells, the first collection of configuration data defining a first logic function of the programmable logic device;
   b. performing the first logic function on a collection of input signals to produce state data;
   c. preserving the state data in a plurality of user storage elements on the programmable logic device;
   d. writing a second collection of configuration data into the plurality of configuration memory cells, the second collection of configuration data defining a second logic function of the programmable logic device; and
   e. performing the second logic function on the state data stored in the user storage elements.

2. The method of claim 1, wherein preserving the state data comprises disabling an input terminal on at least one of the user storage elements.

3. The method of claim 2, wherein the input terminal is a clock terminal.

4. The method of claim 1, wherein the programmable logic device further comprises output circuitry and a plurality of input/output pads, the method further comprising disconnecting the plurality of input/output pads from the output circuitry while writing the second collection of configuration data into the plurality of configuration memory cells.

5. The method of claim 1, wherein the plurality of configuration memory cells are a subset of a set of configuration memory cells.

6. The method of claim 5, wherein the set of configuration memory cells define the first logic function for each of a plurality of configurable logic blocks interconnected by programmable interconnect lines, the method further comprising disabling the interconnect lines while writing the second collection of configuration data into the plurality of configuration memory cells.

7. A programmable logic device comprising:
   a. a plurality of programmable elements, each programmable element including at least one user storage element storing state data;
   b. a programmable interconnect matrix selectively interconnecting the programmable elements;
   c. a plurality of configuration memory cells connected to the programmable elements and the interconnect matrix, wherein the memory cells control the programmable elements and the interconnect matrix to define logical functions of the programmable logic device; and
   d. configuration-control circuitry connected to the user storage elements and preserving the state data stored in the user storage elements as the programmable logic device is configured.

8. The programmable logic device of claim 7, wherein the configuration-control circuitry comprises a sequencer.

9. The programmable logic device of claim 7, wherein the configuration-control circuitry connects to the interconnect matrix.

10. The programmable logic device of claim 9, wherein the configuration-control circuitry disables the interconnect matrix as the programmable logic device is configured.

11. The programmable logic device of claim 7, further comprising a plurality of input/output blocks each selectively connected to a respective one of a plurality of input/output pads, wherein the configuration-control circuitry disconnects the plurality of input/output blocks from the plurality of pads as the programmable logic device is configured.

12. A programmable logic device comprising:
   a. a plurality of programmable elements, each programmable element including at least one user storage element storing state data;
   b. a programmable interconnect matrix selectively interconnecting the programmable elements;
   c. a plurality of configuration memory cells connected to the programmable elements and the interconnect matrix, wherein the memory cells control the programmable elements and the interconnect matrix to define logical functions of the programmable logic device; and
   d. means for preserving the state data stored in the user storage elements as the programmable logic device is reconfigured.

13. The programmable logic device of claim 12, further comprising means for disconnecting the programmable logic device from external circuitry as the device is configured.

14. The programmable logic device of claim 12, further comprising means for disabling the interconnect matrix as the programmable logic device is reconfigured.

15. The programmable logic device of claim 12, wherein the means for preserving the state data disables an input terminal to each of the user storage elements.

* * * * *